(12) United States Patent
Käkelä et al.

(10) Patent No.: US 6,347,945 B1
(45) Date of Patent: Feb. 19, 2002

(54) METHOD AND DEVICE FOR IMPROVING ELECTRICAL CONTACT OF SPRING CONNECTORS

(75) Inventors: Marko Käkelä, San Mauro Torinese (IT); Jussi Hakunti, Piispanristi; Heikki Halkosaari, Paimio, both of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/782,674

(22) Filed: Feb. 13, 2001

(51) Int. Cl.[7] .............................................. H01R 12/00
(52) U.S. Cl. ......................................... 439/66; 310/81
(58) Field of Search ...................... 439/65, 66; 310/81, 310/91

(56) References Cited

U.S. PATENT DOCUMENTS 6,133,657 A * 10/2000 Semenik et al. .............. 310/81
6,254,416 B1 * 7/2001 Folan et al. ................ 439/347

* cited by examiner

Primary Examiner—Khiem Nguyen
(74) Attorney, Agent, or Firm—Ware, Fressola, Van Der Sluys & Adolphson LLP

(57) ABSTRACT

A method and arrangement for improving electrical contact between a printed circuit board and an electrical component, wherein the electrical components have one or more spring contacts to provide electrical connection to one or more pads on the printed circuit board. The contacting point between a spring contact may be oxidized due to humidity, condensation water, chlorides or other environment agents. The oxidation at the contact point degrades the electrical connection and, eventually, causes a total loss in electrical contact. A vibration mechanism is used to cause the electrical components to move relative to the printed circuit board and the spring contacts to rub against the pads. The vibrating motion on the spring contacts cleans the contact points of undesirable materials at the contact points.

13 Claims, 5 Drawing Sheets

METHOD AND DEVICE FOR IMPROVING ELECTRICAL CONTACT OF SPRING CONNECTORS

FIELD OF THE INVENTION

The present invention relates generally to spring contacts in an electronic device and, in particular, to spring contacts between a printed circuit board and an electrical connector.

BACKGROUND OF THE INVENTION

It is not unusual to mount an electrical connector or another electrical component to a printed circuit board (PCB), wherein the electrical contact between the electrical component and the PCB is provided by spring contacts on the electrical component. One general problem in using spring contacts to provide electrical contact to one or more electrically conductive pads on the PCB is that oxidation or dirt may impair the electrical contact at the contacting points. Oxidation or dirt could introduce a thin insulation layer between the contacting surface of the pads and the contacting Surface of the spring contacts. Oxidation can be caused by a variety of factors such as humidity, condensation water, chlorides, nitrogen oxides and other environmental agents. If a spring contact is kept in a fixed position relative to the pad, the problem is likely to become more severe in time and, eventually, a total loss of contact between the spring contact and the PCB may occur.

Thus, it is advantageous and desirable to provide a method and device for improving the electrical contact between a spring contact and a PCB.

SUMMARY OF THE INVENTION

It is a primary object of the present invention to improve the electrical connection provided by spring contacts between two electrical components in general, and between an electrical connector and a printed circuit board (PCB), in particular. The object can be achieved by causing the spring contacts to move back and forth relative to the PCB and thus rub against the electrically conductive pads in a rapid motion for removing the undesirable insulation materials at the contacting points.

According to the first aspect of the present invention, a method of improving electrical contact between a circuit board and an electrical component, wherein the circuit board has at least one electrically conducting section, and the electrical component has at least one spring contact for making electrical contact to the electrically conducting section. The method comprises the steps of:

providing a vibration mechanism adjacent to the electrical component; and
 providing electrical power to the vibration mechanism for causing the electrical component to move relative to the circuit board, thereby causing the spring contact to rub against the electrically conducting section of the circuit board.

According to the second aspect of the present invention, a connector arrangement in an electronic device comprising a circuit board having at least one electrically conducting section and an electrical component having at least one spring contact for making electrical contact with the electrically conducting section of the circuit board. The connector arrangement comprises:

a vibration mechanism, located adjacent to the electrical component, capable of causing the electrical component to move relative to the circuit board, thereby causing the spring contact to rub against the electrically conducting section of the circuit board; and
 means, electrically connected to the vibration mechanism, for providing electrical power to the vibration mechanism to cause the vibration mechanism to move the electrical component when desired.

The present invention will become apparent upon reading the description taken in conjunction with FIGS. 1 to 5.

DETAILED DESCRIPTION OF THE INVENTION

Figure 1:
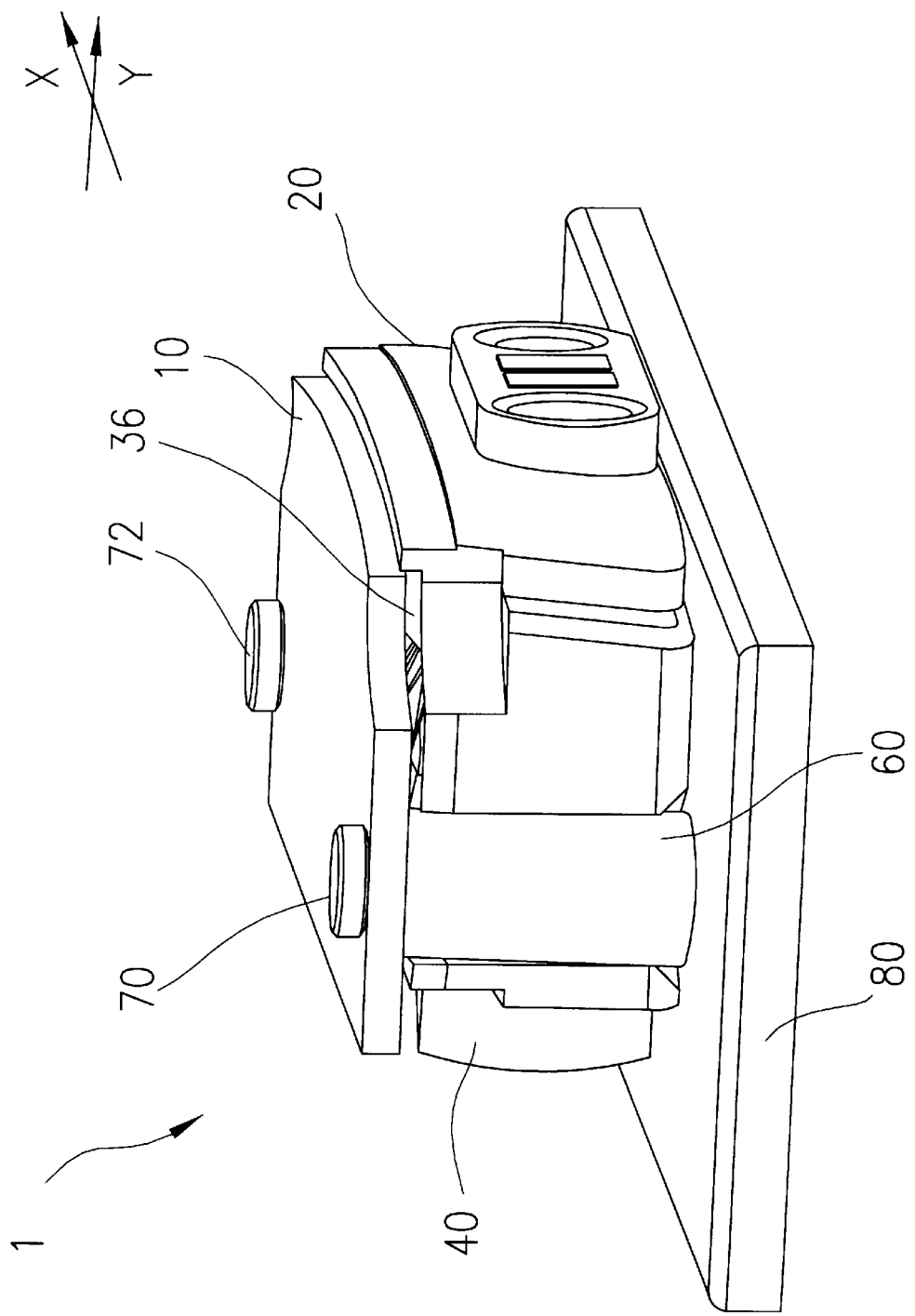
FIG. 1 is an isometric view illustrating a connector arrangement having an electrical connector mounted to a printed circuit board (PCB), according to the present invention.
Figure 2:
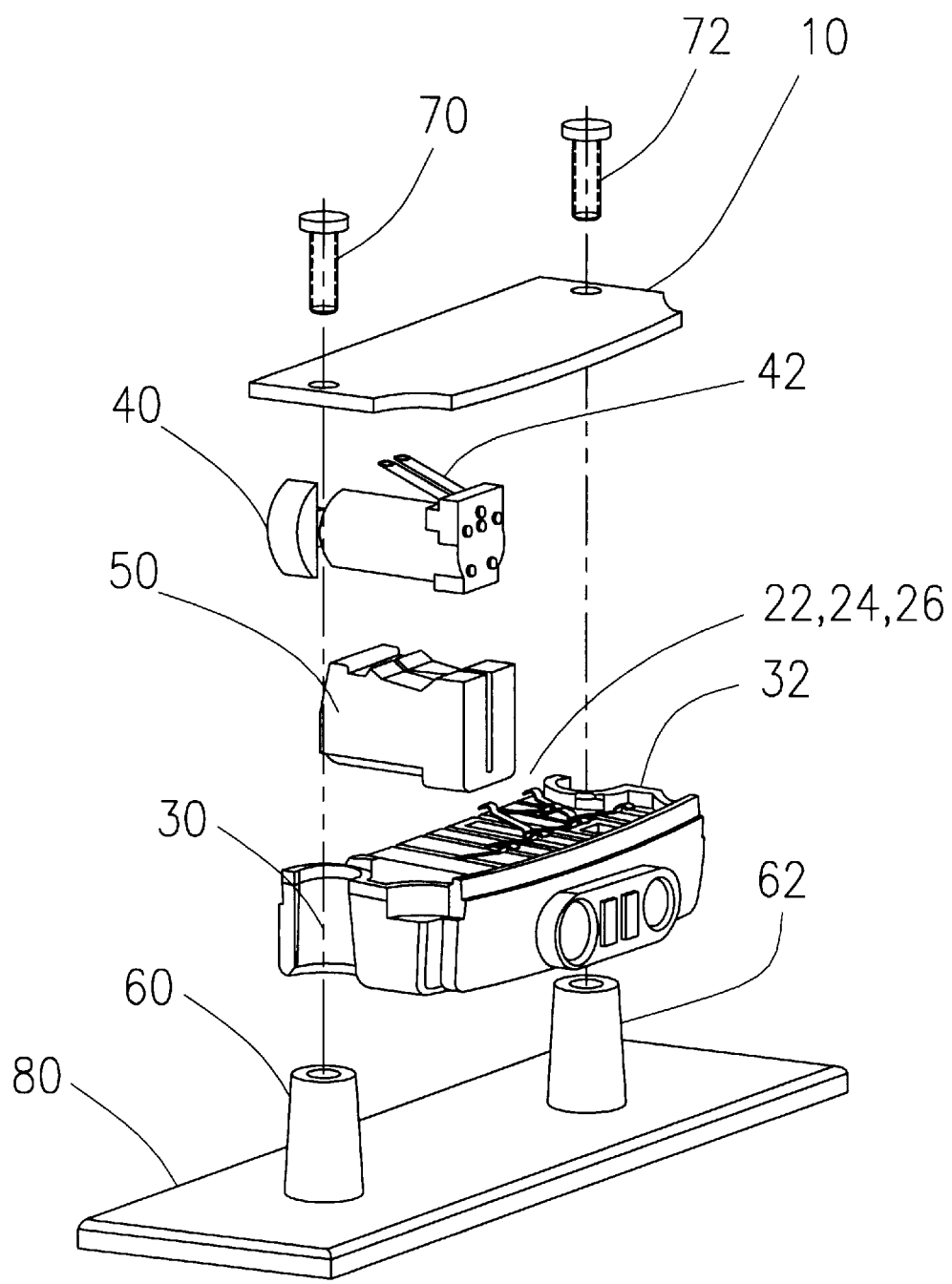
FIG. 2 is an exploded view of the connector arrangement, as shown in FIG. 1.
Figure 3:
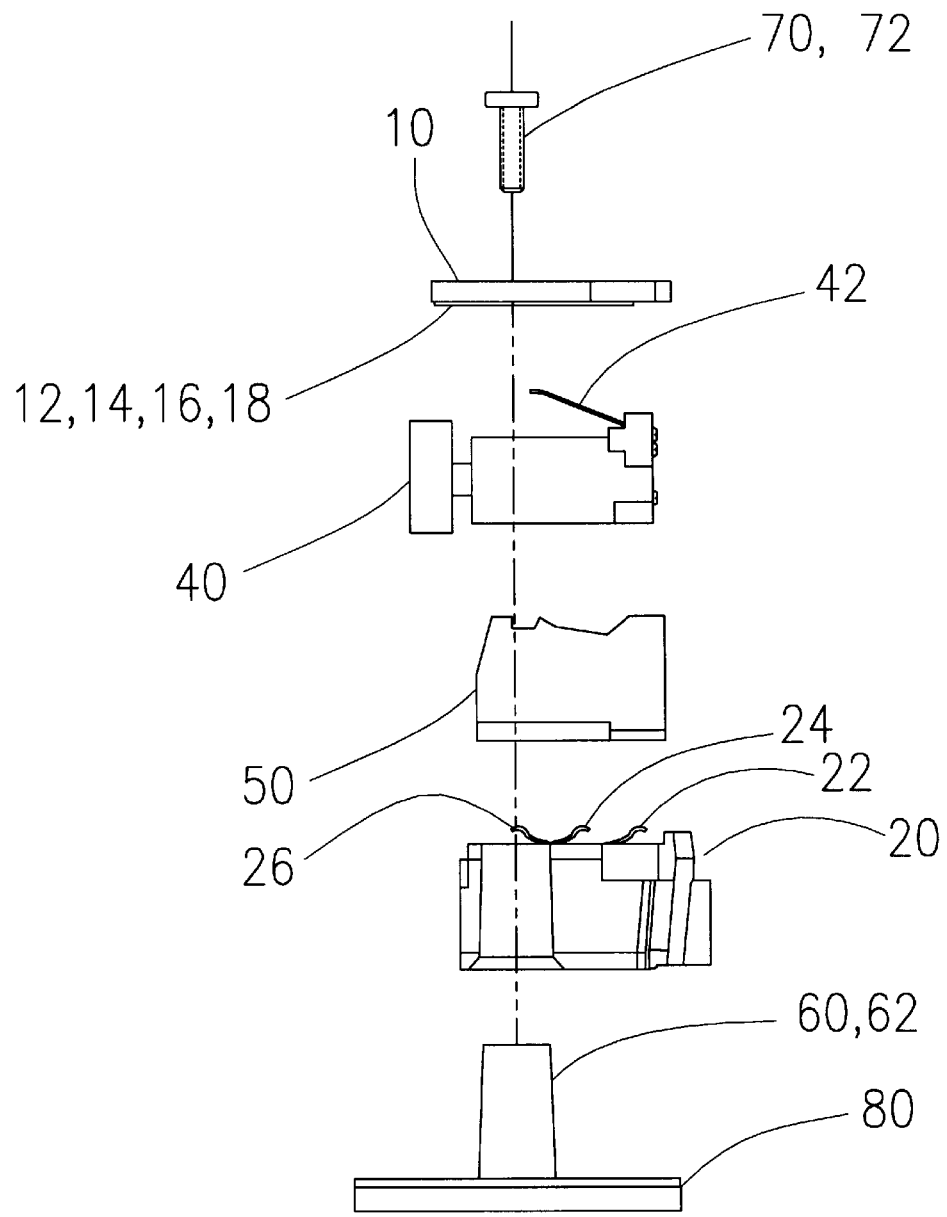
FIG. 3 is an exploded view of connector arrangement, as viewed from one side of the connector arrangement.

An exemplary embodiment of the connector arrangement 1, according to the present invention, is shown in FIGS. 1–5. In the connector arrangement 10 as shown in FIGS. 1–3, a connector 20 is mounted to a printed circuit board (PCB) 10 by means of a bottom plate 80 having two guiding pins 60, 62 and two screws 70, 72. The connector 20 has two frame slots 30 and 32 to accommodate the respective guiding pins 60, 62 . The height of the pins 60 and 62 is slightly greater than the height of the connector 20, leaving a gap 36 between the PCB 10 and the connector 20. The outer diameter of the guiding pins 60, 62 and the inner diameters of the frame slots 30, 32 are designed to have a small gap therebetween to allow the connector 20 to move in the X-Y directions relative to the PCB 10. A vibration motor 40, encapsulated or surrounded by a rubber casing 50 (see FIG. 4) is mechanically engaged with the connector 20, such that when the vibration motor 40 is activated, it causes the connector 20 to move in an oscillating manner, relative to the PCB 10.

FIG. 2 is an exploded view of the connector arrangement of FIG. 1. As shown in FIG. 2, the vibration motor 40 has two electrodes 42 for providing electrical power to the vibration motor 40 for activating the motor 40 when desired. Also shown in FIG. 2 are a plurality of spring contacts 22, 24 and 26 extended from the connector 20 to make contact with the PCB 10. The spring contacts 22, 24 and 26 are clearly shown in FIG. 3, which is an exploded view of connector arrangement, as viewed from one side thereof. Some or all of these spring contacts 22, 24 and 26 can be used to provide electrical connection between the connector 20 and the PCB 10, the others can be used as mechanical means for providing an urging force against the PCB 10 to keep the connector 20 away from the PCB 10.

Figure 4:
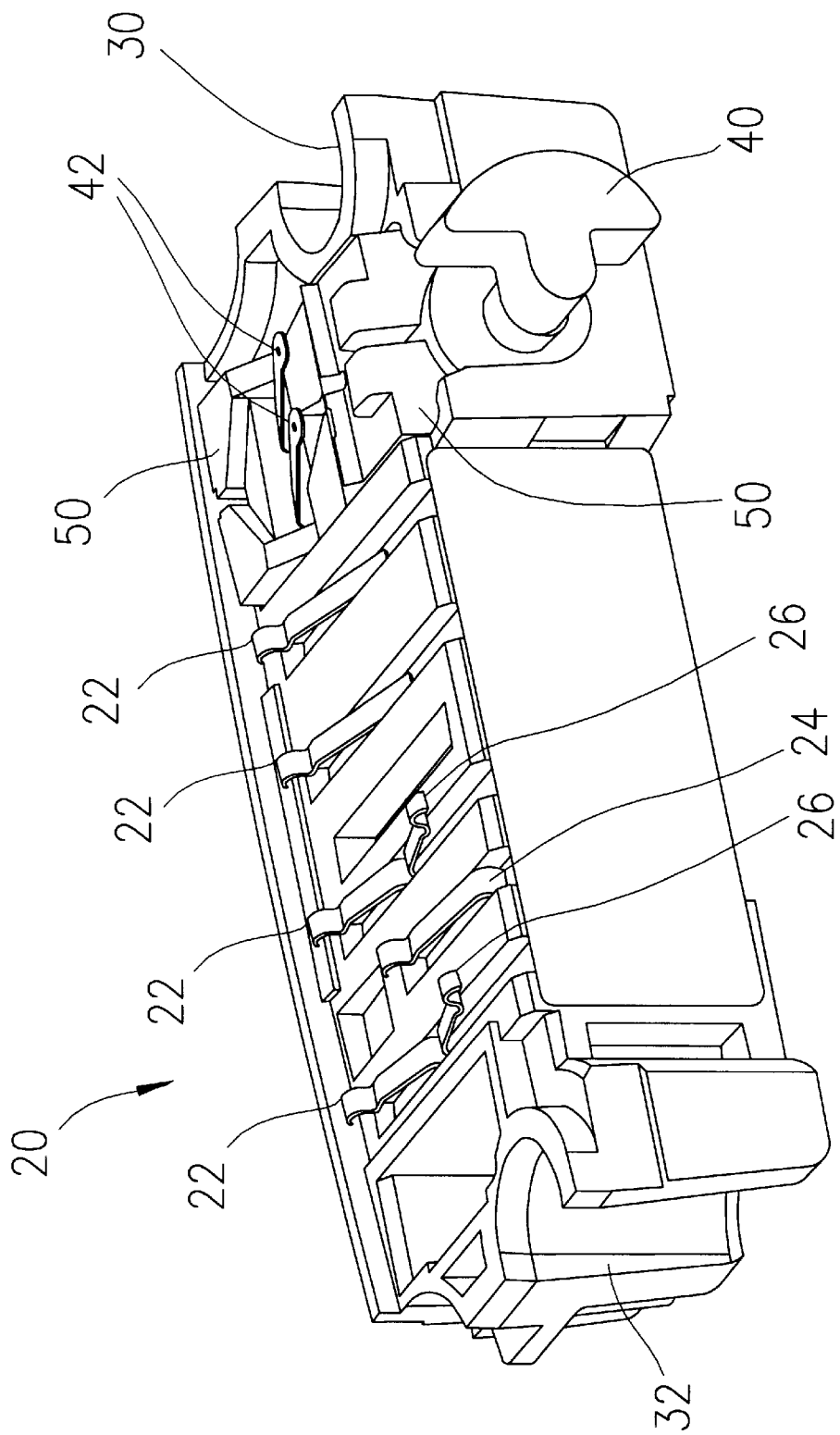
FIG. 4 is a top view illustrating the connector arrangement without the PCB.

FIG. 4 is another isometric view illustrating the top and rear sections of the connector arrangement without the PCB. As shown, the vibration motor 40 is separated from the connector 20 by the rubber casing 50 so as to avoid mechanical damages to the connector 20 due to the vibration. There are four spring contacts 22 in the front row, two spring contacts 26 in the back row and one spring contact 24 in the middle. One or some of these spring contacts can be used to make electrical contact to one or more electronically conductive pads on the bottom side of the PCB 10, as shown in FIG. 5.

Figure 5:
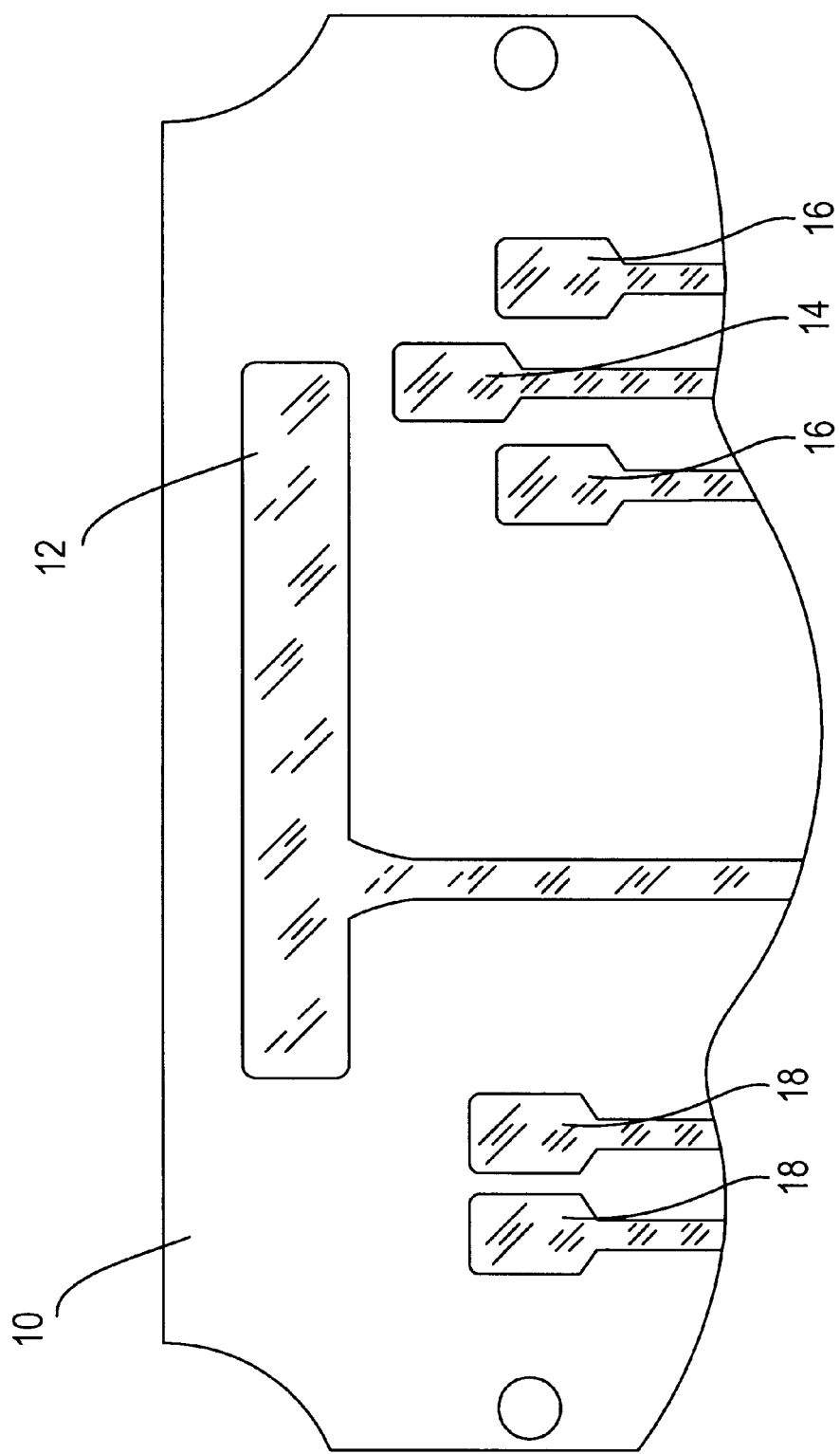
FIG. 5 is a rear view of the PCB illustrating the electrically conductive pads on the PCB.

FIG. 5 is a bottom view of the PCB illustrating the electrically conductive pads on the PCB 10. For illustrative purposes, two pads 18 are used to provide electrical connection to the electrodes 42 of the vibration motor 40 (see FIG. 4); two pads 16 are used to provide electrical connection to the spring contacts 26 of the connectors; pad 14 is used to provide electrical connection to the spring contact 24; and a single pad 12 is used to provide electrical connection to the four spring contacts 22.

The connector arrangement, as illustrated in FIGS. 1–5, involves an electrical connector and a printed circuit board, wherein the electrical connection between the electrical connector and the printed circuit board is provided by one or more spring contacts and one or more electrically conducting pads. However, spring contacts and electrically conducting pads can also be used to provide electrical connection between a printed circuit board and a different electrical component, such as a switch, a solid-state display panel, and a keypad. Spring contacts and electrically conducting pads can be also used between two electrical components.

Furthermore, the vibration motor is activated for causing the connector to move only when desired. Alternatively, a timer or a software program can be used to turn on the vibration motor periodically. It is also possible to use a monitoring means to check the electrical connection between the spring contacts and the electrically conducting pads, and the vibration motor is turned on only when needed.

It is understood that the spring contacts are caused to move by the vibration mechanism only within designed tolerances so the contact points between the spring contacts and the pad can be cleaned because of the mechanical stress or the rubbing action.

Thus, although the invention has been described with respect to a preferred embodiment thereof, it will be understood by those skilled in the art that the foregoing and various other chances, omissions and deviations in the form and detail thereof may be made without departing from the spirit and scope of this invention.

What is claimed is:

1. A method of improving electrical contact of a connector arrangement in an electronic device between a first electrical component and a second electrical component, wherein the first electrical component has at least one electrically conducting section, and the second electrical component has at least one spring contact for making electrical contact with the electrically conducting section of the first electrical component, said method comprising the steps of:

providing a vibration mechanism in the electronic device adjacent to the second electrical component; and providing electrical power to the vibration mechanism for causing the second electrical component to move relative to the first electrical component, thereby causing the spring contact to rub against the electrically conducting section of the first electrical component while the spring contact makes contact with the electrically conducting section of the first electrical component.

2. The method of claim 1, wherein the first electrical component comprises a circuit board.

3. The method of claim 1, wherein the first electrical component comprises a printed circuit board.

4. The method of claim 1, wherein the second electrical component comprises an electrical connector.

5. The method of claim 1, wherein the electrical power is provided to the vibration mechanism when desired.

6. The method of claim 1, wherein the electrical power is provided to the vibration mechanism when needed.

7. The method of claim 1, wherein the vibration mechanism comprises a motor.

8. A connector arrangement in an electronic device comprising a first electrical component having at least one electrically conducting section and a second electrical component having at least one spring contact for making electrical contact with the electrically conducting section of the first electrical component, said connector arrangement comprises:

a vibration mechanism, located adjacent to the second electrical component, capable of causing the second electrical component to move relative to the circuit board, thereby causing the spring contact to rub against the electrically conducting section of the first electrical component while the spring contact makes contact with the electrically conducting section of the first electrical component; and means, electrically connected to the vibration mechanism, for providing electrical power to the vibration mechanism to cause the vibration mechanism to move the second electrical component when desired.

9. The arrangement of claim 8, wherein the first electrical component comprises a circuit board.

10. The arrangement of claim 8, wherein the first electrical component comprises a printed circuit board.

11. The arrangement of claim 8, wherein the second electrical component comprises an electrical connector.

12. The arrangement of claim 8, wherein the vibration mechanism comprises a motor.

13. The arrangement of claim 8, further comprising a buffering means separating the vibration mechanism from the second electrical component for avoiding mechanical damage to the second electric component when the vibration mechanism moves the second electrical component.

* * * * *

UNITED STATES PATENT AND TRADEMARK OFFICE
CERTIFICATE OF CORRECTION

PATENT NO.   : 6,347,945 B1
DATED        : February 19, 2002
INVENTOR(S)  : Käkelä et al.

It is certified that error appears in the above-identified patent and that said Letters Patent is hereby corrected as shown below:

<u>Title page,</u>
Item [56], References Cited, add 2 U.S. PATENT DOCUMENTS listed on Form PTO-892, namely:

```
-- 6,193,523    2/27/01     Harper, Jr.     439/66
   4,605,896    8/12/86     Obrecht         324/158F --
```

<u>Column 1,</u>
Line 22, "Surface" should be -- surface --

<u>Column 3,</u>
Line 9, "arc" should be -- are --
Line 41, "chances" should be -- changes --

Signed and Sealed this

Tenth Day of September, 2002

*Attest:*

JAMES E. ROGAN
*Attesting Officer*   *Director of the United States Patent and Trademark Office*